US007565601B2

(12) United States Patent
Neurohr et al.

(10) Patent No.: US 7,565,601 B2
(45) Date of Patent: Jul. 21, 2009

(54) CIRCUIT FOR CARRYING OUT THE ADD COMPARE SELECT OPERATION WITH A FUNCTIONALITY GOING BEYOND THIS

(75) Inventors: Norbert Neurohr, Neuried (DE); Ingo Feldner, Mannheim (DE); Mario Steinert, München (DE)

(73) Assignee: Infineon Technologies AG, Munich (DE)

( * ) Notice: Subject to any disclaimer, the term of this patent is extended or adjusted under 35 U.S.C. 154(b) by 1099 days.

(21) Appl. No.: 11/040,984

(22) Filed: Jan. 21, 2005

(65) Prior Publication Data
US 2005/0193044 A1 Sep. 1, 2005

(30) Foreign Application Priority Data
Jan. 21, 2004 (DE) ............... 10 2004 003 096

(51) Int. Cl.
*H03M 13/03* (2006.01)
(52) U.S. Cl. ...................................... 714/796
(58) Field of Classification Search ......... 714/794–796; 375/341
See application file for complete search history.

(56) References Cited
U.S. PATENT DOCUMENTS
5,928,378 A * 7/1999 Choi ............................ 714/795
6,504,882 B1 * 1/2003 Kim ............................ 375/341
7,127,667 B2 * 10/2006 Chen et al. .................. 714/795

OTHER PUBLICATIONS

"A Low Power VLSI Architecture of SOVA-based Turbo-code decoder using Scarce State Transition Scheme", Yan Wang, Chi-Ying Tsui and Roger S. Cheng, IEEE International Symposium on Circuits and Systems, May 28-31, 2000, Geneva, Switzerland, vol. 1, 5 pgs.
"On the Equivalence Between SOVA and Max-Log-MAP Decodings", Marc P.C. Fossorier, Frank Burkert, Shu Lin and Joachim Hagenauter, IEEE Communications Letters, vol. 2, No. 5, May 1998, pp. 137-139.
"Digital Communications, Fundamentals and Applications", Second Edition, Bernard Sklar, Upper Saddle River, New Jersey: Prentice Hall, 2001, 4 pgs.
"Parallel Viterbi Algorithm Implementation: Breaking the ACS-Bottleneck", Gerhard Fettweis and Heinrich Meyr, IEEE Transactions on Communications, vol. 37, No. 8, Aug. 1989, pp. 785-790.
"Digital Communications", Fourth Edition, John G. Proakis, McGraw-Hill, 2001, 2 pgs.
"A Viterbi Algorithm with Soft-Decision Outputs and its Applications", Joachim Hagenaur and Peter Hoeher, Global Telecommunications Conference, IEEE Globecom, Nov. 27-30, 1989, pp. 1680-1686.

* cited by examiner

*Primary Examiner*—Shelly A Chase
(74) *Attorney, Agent, or Firm*—Eschweiler & Associates, LLC (57) ABSTRACT

A circuit is disclosed that is designed to carry out add compare select operations for determination of state metrics. The circuit is also designed to carry out a computation operation which goes beyond an add compare select operation for state metric determination, wherein the circuit is either configurable for this purpose and/or has an output for emitting at least one circuit-internal variable which goes beyond the output variable from the add compare select operation.

18 Claims, 7 Drawing Sheets

CIRCUIT FOR CARRYING OUT THE ADD COMPARE SELECT OPERATION WITH A FUNCTIONALITY GOING BEYOND THIS

REFERENCE TO RELATED APPLICATIONS

This application claims the benefit of the priority date of German application DE 10 2004 003 096.0, filed on Jan. 21, 2004, the contents of which are herein incorporated by reference in their entirety.

FIELD OF THE INVENTION

The invention relates to a circuit for carrying out computation operations for a trellis-based algorithm, wherein the circuit is designed to carry out an add compare select operation (ACS operation) for determination of state metrics. The invention also relates to the use of a circuit such as this.

BACKGROUND OF THE INVENTION

Two important components of the baseband signal processing of advanced wire-free communications systems such as the third generation mobile radio systems (3G systems) are the transmission-end channel coding and the reception-end channel decoding. In the case of systems based on the 3GPP standard (3GPP—3rd Generation Partnership Project) technically demanding channel coding methods are used, based on convolution coding and on turbocoding. Turbocodes in particular offer excellent resistance to interference, in which a bit error rate which is still sufficiently low can be achieved at considerably lower transmission power levels, or a considerably lower bit error rate at a higher transmission power level, can be achieved than with other channel coding methods.

The complexity of the coder is in this case fundamentally negligible in comparison to the complexity of the decoder. Decoders such as these generally operate using so-called trellis-based algorithms, which include the Viterbi algorithm, the maximum a posteriori algorithm (MAP) and the soft output Viterbi algorithm (SOVA).

Turbodecoders typically use two soft input/soft output decoder elements (SISO decoders), between which information is interchanged, with the sought decoded value being determined iteratively. The decoder elements use either the MAP algorithm or the SOVA. In contrast to the situation with the turbodecoder, a decoder using convolutional codes does not necessarily need to have an SISO decoder; a simple Viterbi algorithm without a soft output or else the MAP algorithm is thus frequently used for decoding of convolutional codes.

Owing to the complexity of such decoding methods, baseband circuits whose power consumption, surface area and data throughput are designed to be particularly efficient are required in order to produce convenient mobile appliances with low power losses. This necessitates solutions with a high degree of flexibility so that, in particular, different channel coding methods and channel decoding methods for one or more Standards (for example UMTS and GSM) can be implemented using common hardware. Purely software-based solutions using standard processors in principle ensure a high degree of flexibility, but they have weaknesses in terms of the data throughput rate and the power losses. Alternative solutions using dedicated hardware, which allow a high data throughput rate with comparatively low power losses, fundamentally have the disadvantage that the hardware cannot be used as flexibly.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention is directed to circuitry for production of an efficiently operating decoder.

The solution according to one embodiment of the invention is based on a computation circuit for a trellis-based algorithm that is designed to carry out an ACS operation for determination of state metrics. Computation circuits such as these are in principle known from the prior art, for example from the text book "Digital Communications" by Bernard Sklar, 2nd Edition, Prentice Hall, 2001, pages 406-407 and FIG. 7.14. These circuits have inputs for reception of state and branch metrics, with state and branch metrics in each case being logically linked by an add operation element, that is to say by adders. The output signals from the add operation element—in general, two addition processes are carried out—are supplied to a means for comparison (compare operation element), which is generally in the form of a comparator or a subtractor. A multiplexer (select operation element) is controlled as a function of the output signal from the subtractor, and emits on its output side the result of either the first or the second add operation element. In this case, in addition to the output for the selected state metric, the ACS operation also includes the output for the transition associated with the selected state metric (which is also referred to as the traceback bit). Computation circuits such as these may also be in the form of so-called butterfly ACS circuits. In this case, a so-called butterfly is calculated in the trellis diagram. The ACS operation for determination of the state metric is in principle used for the state metric calculation in the Viterbi algorithm and for the forward and backward state metric calculation in the max log MAP algorithm.

One aspect of the invention is to extend a computation circuit such that it can carry out a computation operation that goes beyond the ACS operation. This is achieved by the circuit according to the invention being configurable and/or having an output for emitting at least one circuit-internal variable that goes beyond the output variable from the ACS operation. One computation operation that goes beyond the ACS operation is, for example, an operation for determination of branch metrics.

The computation circuit extension according to the invention has the advantage that it allows multiple uses for different calculation tasks. Circuits that are extended in this way are flexible in terms of the computation operations that are carried out and are used as the data path for the core operations for use in so-called application-specific processors. In this case, by way of example, application-specific means the use of the processor for carrying out a trellis-based algorithm. In contrast to operation-based dedicated hardware, an application-specific processor with one or more circuits operating in parallel can be used more flexibly as a data path by virtue of multiple use. In particular, an application-specific processor thus has considerable advantages in terms of the chip surface area required, in comparison to implementation using dedicated hardware. Furthermore, the use of a processor such as this for more than one task reduces the development time for a baseband chip solution. In comparison to a standard processor, for example a DSP, this results in the advantage that the processing speed and the data throughput are considerably higher. This advantage is extended further in particular by two or more circuits processing data in parallel. Furthermore, an application-specific processor such as this is more efficient than a standard processor in terms of power losses.

In this case, the invention makes use of the discovery that a large number of computation operations relating to a trellis-based algorithm for the ACS operation for determination of the state metrics are highly similar; these operations can thus be mapped with only minor changes to the structure of the basic circuit onto an extended circuit as an optimized data path.

In addition to the use of the circuit according to the invention in a decoder which operates using a trellis-based algorithm, the circuit according to the invention can also be used in an equalizer which operates using a trellis-based algorithm, for example a maximum likelihood equalizer based on a Viterbi algorithm. It would even be feasible to use the circuit according to the invention for both decoding and for equalization in the time-division multiplex mode.

The trellis-based algorithm is preferably at least one of the following algorithms: the Viterbi algorithm, a logarithmically operating MAP algorithm, in particular the max log MAP algorithm, or the soft output Viterbi algorithm.

In particular, the circuit can also be used for carrying out computation operations using two or more of the above algorithms. The preference for the logarithmically operating MAP algorithm, in particular the max log MAP algorithm, over the general MAP algorithm is justified by the fact that a logarithmically operating MAP algorithm uses addition and subtraction processes instead of multiplication and division processes as in the MAP algorithm. Computation operations using a logarithmic MAP algorithm are thus fundamentally closely related to the ACS operation, for example the determination of the state metrics when using the max log MAP algorithm and when using the Viterbi algorithm are identical.

The circuit according to one exemplary embodiment of the invention for carrying out computation operations that go beyond the ACS operation is designed for determination of branch metrics, in one example. In this case, the circuit according to the invention calculates not only state metrics, but also branch metrics. In particular, for this purpose, it is possible to provide that at least one computation means that is provided in the circuit for carrying out the ACS operation can also be switched for subtraction or addition as a configurable computation means for addition or subtraction.

In one example, it is preferable to provide an output variable from a computation means for addition or subtraction to be read at the output of the circuit. In particular, the output variable of the computation means which carries out the compare operation element, and/or the output variable from the computation means which carries out the add operation element is provided at the output of the circuit.

Fundamentally, branch metrics for the individual state transitions in a trellis diagram are determined by logically linking two or more soft input input values by addition or subtraction processes using a calculation rule that is dependent on the state transition. The use of control signals for appropriate switching of the computation means, which according to the invention are configurable, allows any branch metric for any state transition to be calculated using the circuit according to the invention, and also allows the branch metric to be read out on the output side, assuming corresponding availability of the output of the computation means. In this case, a calculated branch metric is calculated by means of the circuit according to the invention either in one signal run, or only one operation element is carried out in the first signal run, whose result is tapped off on the output side and is processed further on the input side of the same circuit, or on a different circuit, according to the invention. In principle, the calculation of branch metrics is necessary for every trellis-based algorithm. In particular, it is within the scope of the invention for the computation operations that go beyond the ACS operation to relate to the determination of branch metrics both of the Viterbi algorithm and of the max log MAP algorithm.

The configurability of a computation means or the output-side availability of the output signal from a computation means need not necessarily in this case be linked to the calculation of branch metrics. The fact that one or more output variables from the calculation means for addition and subtraction are tapped off at the output of the circuit offers, in particular, the advantage that there is no need to calculate a maximum, as is obligatory with the ACS circuit that is known from the prior art. This may be advantageous for the calculation of the reliability information for the max log MAP algorithm, since the two circuit-internal output values from the add operation element must be read without carrying out the maximum formation process in order to calculate the reliability information.

The circuit is advantageously designed such that the most significant bit in the control signal of the computation means which carries out the compare operation element is supplied to an inverter, whose output variable can be read as a traceback bit for the Viterbi algorithm at the output of the circuit. The traceback bit may be stored in a memory means. This information is accessed via a so-called traceback in order to subsequently indicate the decided bit or a decided bit sequence.

According to one advantageous embodiment of the circuit, the computation operations that are carried out using the circuit relate both to the Viterbi algorithm and to the max log MAP algorithm. This means that the circuit can be used for both algorithms. In comparison to solutions in which one computation circuit is associated with only one algorithm, this offers the advantage that chip surface area can be saved for a decoder that is based on the circuit and controls both algorithms.

The computation operations that are carried out using the circuit advantageously relate to: the branch metric calculation both for the Viterbi algorithm and for the max log MAP algorithm, the state metric calculation for the Viterbi algorithm, the backward and forward state metric calculation for the max log MAP algorithm, the determination of the traceback bits for the Viterbi algorithm, and the determination of the soft output values from the state metrics using the max log MAP algorithm.

Accordingly, all of the major calculations for the max log MAP algorithm and for the Viterbi algorithm can be mapped onto the circuit according to the invention. Furthermore, it is feasible for the circuit also to carry out operations for determination of the reliability information for the max log MAP algorithm, which will be explained in more detail further below. The circuit according to the invention can thus be used as a universal data path, thus making it possible to save chip surface area for a decoder based on the circuit in the form of an application-specific processor, in comparison to a decoder based on dedicated hardware. In comparison to a decoder that is implemented in the form of a software-based standard processor, the present invention provided for a greater throughput rate. The circuit according to the invention can thus be used to carry out operations for turbodecoding using the max log MAP and for carrying out operations for convolution decoding using the Viterbi algorithm.

On the basis of another embodiment of the invention, the circuit according to the invention is based on an ACS circuit. In this case, the circuit according to the invention is used for a soft output Viterbi algorithm. One aspect of the second embodiment of the invention is that the circuit according to the invention has an additional means for determination of a minimum, which is used for carrying out at least one computation operation that goes beyond the ACS operation.

The soft output Viterbi algorithm (SOVA) is based on the simple Viterbi algorithm. In contrast to the simple Viterbi algorithm, the SOVA results in reliability information also being produced for each bit, in addition to the decoded bit sequence. Thus, as described above, the SOVA is an SISO algorithm that is suitable for use in a decoder element of a turbodecoder. The process of determination of the maximum likelihood path (ML path)—that is to say the so-called "hard" decision information (hard decision)—is identical to the simple Viterbi algorithm and with the SOVA. The additional reliability information for each individual decided bit, which corresponds to a soft output value, is determined from the difference between the state metrics for the ML path and for the so-called secondary path. The secondary path is distinguished in that it opens into the same state as the ML path, but has a lower path metric than the ML path. The principles of the SOVA are described in the text book "Digital Communications" by John G. Proakis, 4th Edition, McGraw-Hill, page 509. Further details relating to the SOVA can be found in the article "A Viterbi Algorithm with Soft-Decision Outputs and its Applications", J. Hagenauer and Peter Hoeher, IEEE Globe-com 1989, pages 1680 to 1685.

One or more different conditional operations, which are based on the determination of a minimum, are required in order to determine the reliability information using the SOVA. In one example of the invention, the result of the operation is emitted only when a condition that is satisfied by the input variables of the circuit exists. According to one alternative refinement of the circuit, a result can also be emitted continuously, but this is marked as being valid only when a condition which is satisfied by the input variables of the circuit exists, for example by setting a specific output bit.

The circuit according to the invention has an advantage that the circuit can be used not only for the ACS operation but also for other computation operations that are related to the SOVA. This means that hardware is used jointly for a number of computation operations, so that the chip surface area of a decoder based on the circuit according to the invention is smaller than in the case of a solution based on dedicated hardware. In comparison to a decoder that is implemented in the form of a software-based standard processor, the present invention provides for improved data throughput.

The at least one computation operation which goes beyond the ACS operation is advantageously either the determination of the path metric for the secondary path to the ML path for the time step k, or the determination of the difference between the metrics of the secondary path and of the ML path for the time step k. For this purpose, in addition to two or more state metrics and one or more branch metrics, the circuit receives one or more additional input variables, which signal the association between the individual state metrics for the time step k−1 for the ML path. In this case, it is advantageous for the circuit to have a first input for reception of a first signalling bit, which is associated with a first state metric that is read in as an input variable, and a second input for reception of a second signalling bit, which is associated with a second state metric that is read in as an input variable. In this case, the first signalling bit and the second signalling bit signal the association between the first and the second state metric, respectively, that have been read in and the ML path.

In principle, the SOVA can be carried out as a multiple step SOVA, in order to minimize the amount of memory required. In a first step, a simple Viterbi algorithm is carried out, in order to determine the ML path. In a second step, another forward recursion process, inter alia, is carried out. In this case, one ACS operation is carried out for each step. However, in order to indicate the reliability information, the difference between the path metrics for the ML path and the respective secondary path need additionally be determined only for the one state through which the ML path passes. The path metric for the ML path is the maximum in this case, and that for the secondary path is the minimum of two path metrics, whose associated paths open into the same state. In this case, both the maximum as part of the conventional ACS operation and the minimum, which can be determined only once in each time step k, are calculated by the circuit according to the invention. Since the circuit according to the invention has inputs for reception of appropriate signalling bits, which signal the association between the respective state metric and the ML path, it is possible to decide within the circuit whether or not a minimum need be calculated. For a minimum to be calculated, a signalling bit must signal the association between the corresponding state metric and the ML path. For example, the association exists when the signalling bit corresponds to logic 1. In this case, in principle, it is feasible for the signalling bit to form the most significant bit of a common word comprising a state metric and an associated signalling bit.

In this case, the invention makes use of the discovery that the ACS operation and the process of determination of the path metric for the secondary path which is carried out in the additional forward recursion operation differ, fundamentally, only in that a maximum is determined in the first case, and a minimum in the second case. The extension of the circuit according to the invention allows both operations to be carried out using the same hardware circuit. The additional inputs determine whether the minimum formation process is valid.

According to one advantageous embodiment of the circuit according to the invention, the circuit has a third input for reception of the decided bit for the ML path that relates to the transition from the time step k−1 to the time step k. In addition to indication of the signalling bits which indicate the association between the respective state metric and the ML path, the output of the result of the minimum operation and its marking are dependent on the bit which has already been decided on for the ML path, which is associated with the transition from a state on the ML path for the time step k−1 to a state for the time step k. This is justified by the fact that one state on the ML path for the time step k−1 has two state transitions, only one of which opens into a state on the ML path for the time step k. However, according to the SOVA, only the path metric for the secondary path which opens into the state on the ML path for the time step k should be determined using a minimum operation. Taking account according to the invention, of the decided bit which is associated with the transition from a state on the ML path for the time step k−1 to a state for the time step k allows the more probable transition of the two possible transitions from the time step k−1 to the time step k to be identified within the circuit, so that the minimum operation and its marking are taken into account in the output of the result.

The circuit is advantageously designed in one example such that it has a first output, and a third signalling bit is emitted via the first output. The third signalling bit is assigned to the state metric, as determined by the ACS operation, for the time step k, and signals the association between this state metric and the ML path. In this case, the circuit is designed such that the third signalling bit signals the association with the ML path only when either the first or the second signalling bit signals the association between the corresponding state metrics for the time step k−1.

In one example, the third signalling bit is implemented in circuitry by logically linking the first and the second signalling bits via an OR gate or an XOR gate. The value of the third signalling bit is dependent not only the first and second signalling bits, but also on the decided bit for the ML path.

The above measure therefore means that, during the additional forward recursion process, the circuit uses the state metrics for the time step k−1 to mark that state metric for the time step k which is associated with the ML path, by choice of the third signalling bit. During the subsequent forward recursion process starting from the state metrics for the time step k, the value of the third signalling bit is applied to the input side of the circuit, as the first and second signalling bits, respectively, together with the corresponding state metric. Since the forward recursion process is carried out successively for all the time steps, all the state metrics which are associated with the ML path are thus marked by setting the associated signalling bits, for example to a logic 1. This is, of course, dependent on the ML path starting in the so-called zero state at the time k=0, with the associated signalling bit being set.

Alternatively, or in addition to a computation operation which goes beyond the ACS operation, SOVA-specific updating of a soft output value $L(k-i)$ for a previous time step $k-i$ within an updating window is advantageous, where i is an integer. For this purpose, the soft output values that are required for updating are read in via the inputs that are associated with the state and/or branch metrics. In this case, the circuit has a first input for reception of the ML path bit that is associated with the time step k−i, and a second input for reception of the secondary path bit that is associated with a time step k−i. In this case, it is advantageous for the circuit to be designed such that it has a first output, with the value of a third signalling bit, which is emitted via the first output, depending on whether the bits which are read in at the first input and at the second input are or are not identical.

Thus, the circuit according to the invention can also be used for the so-called SOVA secondary traceback, which follows the additional forward recursion process in the algorithm and includes the updating of the soft output values $L(k-i)$ for a time step k for all time steps k−i where i=1, 2, . . . , ws (ws—window size).

The updating rule for the secondary traceback is: $L(k-i)$ ←min $(\Delta(k), L(k-i))$, provided that $$U^1(k-i) \neq U^2(k-i) \quad (1).$$

In this case, $\Delta(k)$ denotes the metric difference between the ML path and the secondary path for the time step k, $U^1(k-i)$ denotes the decided bit for the ML path for the time step k−i, $U^2(k-i)$ denotes the bit for the secondary path for the time step k−i, and $L(k-i)$ denotes the soft output value for the time step k−i.

Thus, according to equation 1, a minimum determination process is carried out only when the bit $U^1(k-i)$ for the ML path and the bit $U^2(k-i)$ for the secondary path are different. This is therefore a conditional determination of a minimum. Thus, according to the invention, the ML path bit $U^1(k-i)$ associated with the time step k−i and the secondary path bit $U^2(k-i)$ associated with the time step k−i are respectively applied via the first input and via the second input to the circuit. If the two bits differ, the result of a minimum operation is emitted, and is marked as being valid. This can be done by using an XOR gate to logically link the bits received via the first and the second input.

The circuit for carrying out the first or the second SOVA-specific operations as described above is advantageously designed such that the value of the third signalling bit marks the result of the computation operation which goes beyond the ACS operation as being valid or invalid. In this case, the computation operation which goes beyond the ACS operation is, by way of example, the determination of the state metric for the secondary path to the ML path, or the determination of the difference between the path metric for the secondary path and the ML path, or the updating of a soft output value for the time step k−i.

The circuit according to the various aspects of the invention is advantageously designed in such a way that the advantages of the various aspects of the invention are combined in one circuit.

A combined circuit according to the invention advantageously has two of the circuits as described above as circuit elements, with both circuit elements being associated with one and the same butterfly on the trellis diagram. With regard to a combined ACS circuit such as this, reference is made to the textbook "Digital Communications" by Bernard Sklar, 2nd Edition, Prentice Hall, 2001, pages 406-407. The circuit structure illustrated in FIG. 7.14 there is used to calculate a butterfly on the trellis diagram.

One advantageous refinement of the combined circuit provides for the combined circuit to be designed in such a way that, when carrying out an ACS operation, only one branch metric value is read in on the input side per operation, and is supplied to the computation means, which are provided for the add operation element, in both circuit elements. In this case, at least one computation means is designed such that it can be switched for subtraction in each circuit element, in order to take account of an inverted branch metric value.

This offers the advantage that only one variable, instead of four input variables for asymmetric branch metrics or two input variables for symmetrical branch metrics, need be transferred to the combined circuit according to the invention in order to produce the values of the branch metrics. The variable that is applied to the input side is inverted within the circuit. This measure reduces the length of an instruction word that results in the branch metrics being calculated in the application-specific processor.

A first application-specific processor according to the invention for decoding received data has n circuits, or has n/2 combined circuits. In this case, n indicates the number of ACS operations that can be carried out at the same time. The number n in this case corresponds to a natural number that can be selected as required, that is to say, including the number 1. In this case, there is no need for the number n to correspond to the number of states in the trellis diagram. If the number n is less than the number of states in the trellis diagram, the circuits will operate on a time-division multiplexing basis with regard to the ACS operation.

A further application-specific processor according to the invention for decoding received data has either n circuits, or n/2 combined circuits in order to calculate n ACS operations at the same time, with each combined circuit in each case having two circuits as circuit elements, with both circuit elements being associated with one and the same butterfly on the trellis diagram. This application-specific processor also has a memory means for storage of the state metrics that are determined by the ACS operation, and of the respectively associated signalling bits. In this case, the signalling bits together with the respectively associated state metrics in each case preferably form a common memory word in the memory means.

The storage of a signalling bit and of an associated state metric as a common memory word involves little complexity, since structures associated with the state metric, in particular data buses, can also be used for the signalling data. These structures simply have one bit added to them.

The aim of this additional embodiment of the invention is to use an ACS circuit (either an ACS circuit as known from the prior art or else one of the ACS circuits according to the invention) for operations for determination of a soft output value L(k) using the max log MAP algorithm. In this case, either two forward and two backward state metrics or just two calculated intermediate results are applied as input variables to the inputs of the circuit.

The advantageous feature of use according to the invention is the multiple use of hardware. According to the invention, the circuit can be used not only for carrying out an ACS operation for determination of state metrics, but also for operations for the determination of a soft output value using the max log MAP algorithm.

The basis of the use according to the invention is the discovery that the operations to be carried out for calculation of a soft output value are similar to the ACS operation for determination of state metrics.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention will be explained in more detail in the following text using a number of exemplary embodiments and with reference to the drawing, in which.

DETAILED DESCRIPTION OF THE INVENTION

Figure 1:
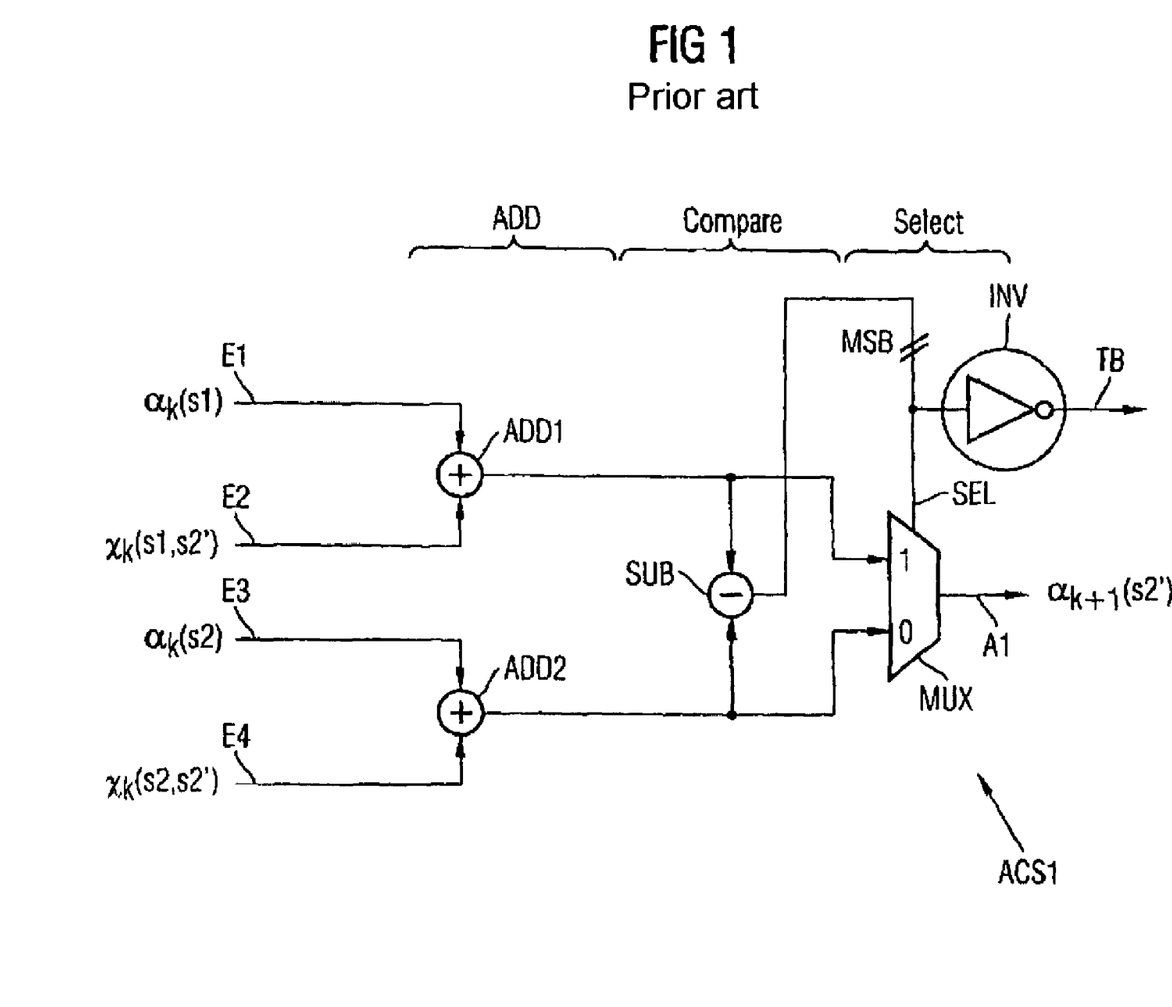
FIG. 1 is a schematic diagram illustrating a circuit for carrying out an ACS operation according to the prior art.

FIG. 1 shows an ACS circuit according to the prior art, which is subdivided into three areas. In a first area, which is assigned the add operation element, a first state metric $\alpha_k(s1)$ for the state s1 for the time step k and a first branch metric $\chi_k(s1, s2')$ from the state s1 to the state s2' for the time step k are added by means of the adder ADD1, where $\alpha_k(s1)$ and $\chi_k(s1, s2')$ are read in via the inputs E1 and E2, respectively. In the same way, a second state metric $\alpha_k(s2)$ and a second branch metric $\chi_k(s2, s2')$, which are read in via the inputs E3 and E4, are added by means of the adder ADD2. The result of the first adder ADD1 and the result of the second adder ADD2 are passed to a subtractor SUB (compare operation element), which may also be in the form of a digital comparator. The most significant bit SEL in the output signal from the subtractor SUB is used as a control signal for driving a multiplexer MUX (select operation element), which connects the output of ADD1 to the output A1 when the output signal from ADD1 is greater than the output signal from ADD2. Alternatively, the output of ADD2 is connected to the output A1 when the output signal from ADD1 is less than the output signal from ADD2. The signal at A1 corresponds to the state metric $\alpha_{k+1}(s2')$ of the state s2' for the time step k+1. Furthermore, the traceback bit can be obtained from the signal SEL, and can additionally be emitted at TB.

The state metrics $\alpha$ and the branch metrics $\chi$ relate both to the forward recursion process in the Viterbi algorithm and to the forward recursion process in the max log MAP algorithm. Furthermore, the circuit illustrated in FIG. 1 can also be used for the backward recursion process for the max log MAP algorithm. In this case, the input-side state metrics $\beta_{k+1}$ for the backward recursion process correspond to the state metrics $\alpha_k$ for the forward recursion process, and the output-side state metric $\beta_k$ for the backward recursion process corresponds to the state metric $\alpha_{k+1}$ of the forward recursion process.

Figure 2:
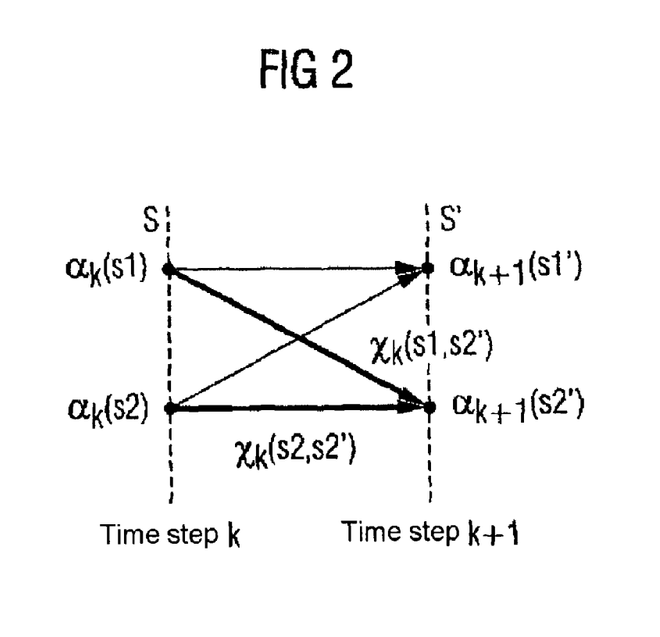
FIG. 2 is a portion of a trellis diagram illustrating the calculation of state metrics for the forward recursion process using the Viterbi or the max log MAP algorithm.

FIG. 2 shows an illustration of the calculation of state metrics for the forward recursion process using the Viterbi algorithm or the max log MAP algorithm, on the basis of a detail of a trellis diagram. The ACS operation illustrated in FIG. 1 corresponds to the arrows shown with a thick line width. The arrows with a thin line width represent a further ACS operation. If two circuits as shown in FIG. 1 are arranged as shown in FIG. 2, a so-called butterfly is calculated.

Figure 3:
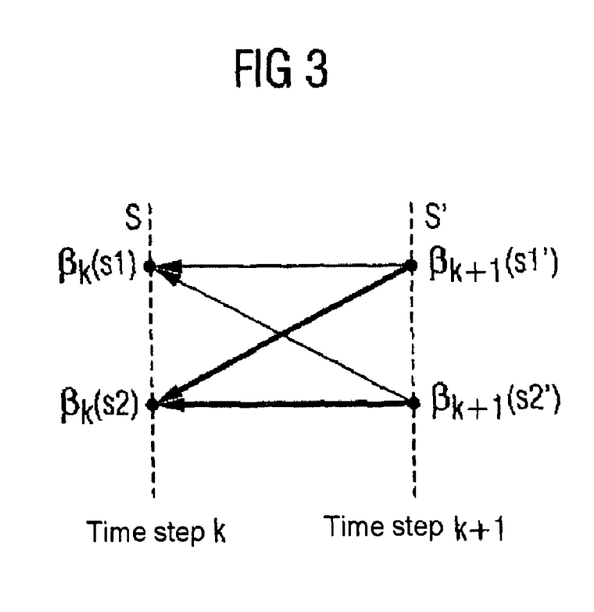
FIG. 3 is a portion of a trellis diagram illustrating the calculation of state metrics for the backward recursion process using the max log MAP algorithm.

FIG. 3 shows an illustration of a calculation of state metrics for the backward recursion process using the max log MAP algorithm, on the basis of a butterfly.

Figure 4:
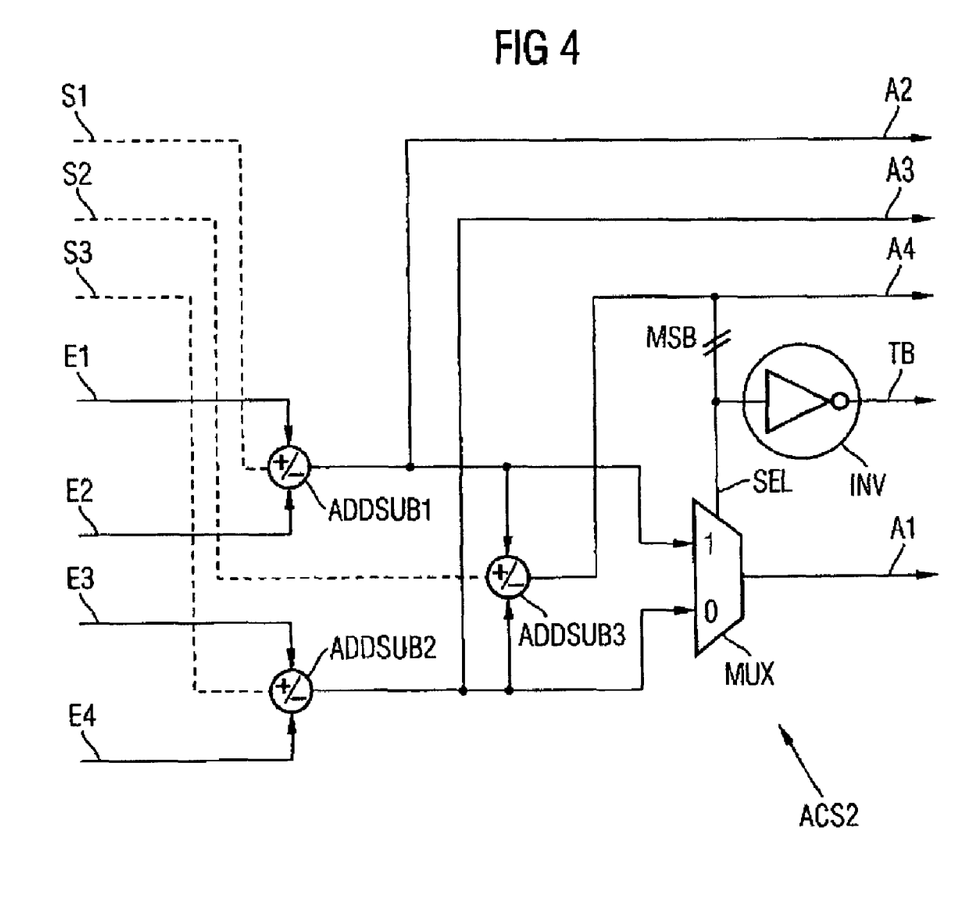
FIG. 4 is a schematic diagram illustrating a circuit according to a first exemplary embodiment of a circuit according to the invention.

FIG. 4 shows a first exemplary embodiment of a circuit according to the invention based on a first aspect thereof. Switchable computation elements ADDSUB1 and ADDSUB2 are used instead of the adders ADD1 and ADD2 shown in FIG. 1. Furthermore, a switchable computation element ADDSUB3 is used instead of the subtractor SUB. The switchable computation elements ADDSUB1-ADDSUB3 each operate as adders when control signals S1-S3 that are associated with the computation elements have the digital value 1, and as subtractors when the control signals s1-s3 each have the digital value 0. In addition to the outputs of the circuit as shown in FIG. 1, the circuit shown in FIG. 3 has three further outputs A2, A3 and A4. The output signals from the computation elements ADDSUB1-ADDSUB3 can thus be read out on the output side. Furthermore, the traceback bit TB is emitted via the inverter INV, by inversion of the signal SEL. Table 1 shows the input-side configuration of the inputs E1 to E4 as well as S1 to S3 for the circuit in FIG. 4 in order to carry out three different ACS operations. A distinction is drawn in this case between different ACS operations. These relate either to the determination of the state metric for the forward recursion process using the Viterbi algorithm, or using the max log MAP algorithm, or to the determination of the state metric for the backward recursion operation using the max log MAP algorithm. Furthermore, Table 2 shows the corresponding use of the outputs A1 to A4 on the output side.

TABLE 1

| | Signals on the input side | | | | | | |
|---|---|---|---|---|---|---|---|
| Computation operation relates to | E1 | E2 | E3 | E4 | S1 | S2 | S3 |
| Determination of the state metric for the forward recursion process using Viterbi algorithm | $\alpha_{k(S1)}$ | $\chi_k(s1,s2')$ | $\alpha_k(s2)$ | $\chi_k(s2,s2')$ | 1 | 0 | 1 |
| Determination of the state metric for the forward recursion process using max log MAP algorithm | $\alpha_k(s1)$ | $\chi_k(s1,s2')$ | $\alpha_k(s2)$ | $\chi_k(s2,s2')$ | 1 | 0 | 1 |
| Determination of the state metric for the backward recursion process using max log MAP algorithm | $\beta_{l+1}(s1')$ | $\chi_k(s1',s2)$ | $\beta_{k+1}(s2')$ | $\chi_k(s2',s2)$ | 1 | 0 | 1 |

TABLE 2

| | Signals on the output side | | | |
|---|---|---|---|---|
| Computation operation relates to | A1 | A2 | A3 | A4 |
| Determination of the state metric for the forward recursion process using Viterbi algorithm | $\alpha_{k+1}(s2')$ | — | — | — |
| Determination of the state metric for the forward recursion process using max log MAP algorithm | $\alpha_{k+1}(s2')$ | — | — | — |
| Determination of the state metric for the forward recursion process using max log MAP algorithm | $\beta_k(s2)$ | — | — | — |

TABLE 3

| | Branch metrics $\chi_k(s,s')$ | |
|---|---|---|
| State transition $W^0/W^1/(W^2)$ | Branch metrics $\chi_k(s,s')$ for a code rate of ½ | Branch metrics $\chi_k(s,s')$ for a code rate of ⅓ |
| 00(0) | $+L^0+L^1$ | $+L^0+L^1+L^2$ |
| 01(0) | $+L^0-L^1$ | $+L^0-L^1+L^2$ |
| 10(1) | $-L^0+L^1$ | $-L^0+L^1-L^2$ |
| 11(1) | $-L^0-L^1$ | $-L^0-L^1-L^2$ |
| 001 | — | $+L^0+L^1-L^2$ |
| 011 | — | $+L^0-L^1-L^2$ |
| 100 | — | $-L^0+L^1+L^2$ |
| 110 | — | $-L^0-L^1+L^2$ |

The calculation of branch metrics using the circuit according to the invention as shown in FIG. 4 will be described in the following text. This is done, by way of example, for a number of selected codes, since the calculation is in principle dependent on the code that is used. Furthermore, the calculation is carried out in a similar manner both for the Viterbi algorithm and for the max log MAP algorithm.

Coding by means of a convolutional code is provided in addition to turbocoding in the UMTS mobile radio standard. Two different convolutional codes with 128 states and a code rate of ½ and ⅓ are provided for this purpose. These are described in detail in Section 4.2.3.1 of the UMTS Standardization Document 3GPP TS 25.212, V3.5.0, which is hereby incorporated by reference in its entirety. The symmetrical branch metrics from a state s to a state s' are determined for convolutional codes such as these with a code rate of ½ and ⅓ using the following equations 2 and 3, respectively:

$$\chi_k(s,s')=(1-W^0((k))\cdot L^0(k)+(1-W^1(k))\cdot L^1(k) \quad (2),$$

$$\chi_k(s,s')=(1-W^0(k))\cdot L^0(k)+(1-W^1(k))\cdot L^1(k)+(1-W^{2}(k))\cdot L^2(k) \quad (3).$$

In this case, $W^i(k)$ denotes the 2 (code rate ½) or 3 (code rate ⅓) coded bits which are associated with one uncoded bit, and which describe the transition from one state to another state. Furthermore, $L^i(k)$ denotes the soft input values that have been received instead of the digital bits $W^i(k)$. Equation 1 and equation 2 can be changed to tabular form as shown in Table 3, in which case the branch metrics $\chi_k(s,s')$ may be determined from sums and differences of the soft input values $L^i(k)$.

The calculation of the branch metrics $\chi_k(s,s')$ from sums and differences of the soft input values $L^i(k)$ can be carried out using the circuit according to the invention as illustrated in FIG. 4. By way of example, in order to calculate a state transition 000 for a code rate of ⅓, the inputs must be connected as follows: E1=$L^0$, E2=$L^1$, E3=$L^2$, E4=0, S1=1, S2=1, and S3=1. The sought branch metric $\chi_k(s,s')$ is then emitted at A4. In order to calculate the branch metric for a state transition 011 for a code rate of ⅓, the inputs are connected as follows E1=$L^0$, E2=$L^1$, E3=$L^2$, E4=0, S1=0, S2=0 and S3=1 and the sought branch metric is then emitted at A4. The further branch metrics both for the code rate of ⅓ and for the code rate of ½ are calculated analogously.

If a turbocode is alternatively used, for example the turbo code that is used in the UMTS standard and is described in Section 4.2.3.2 of the UMTS Standardization Document 3GPP TS 25.212, V3.5.0, which is hereby incorporated by reference in its entirety, the calculation of the branch metrics for decoding with the aid of the max log MAP algorithm is carried out in a similar way to that previously described. This is a code with 8 states. The branch metrics $\chi_k(s,s')$ are determined using the following equations:

$$X(s,s')=\overline{X}(k)\cdot L^s(k)+\overline{Z}(k)\cdot L^P(k)+\overline{A}(k)\cdot L^{apri}(k) \quad (4),$$

$$\chi_k(s,s')=(1-2X(k))\cdot L^s(k)/2+(1-2Z(k))\cdot L^P(k)/2+(1-2A(k))\cdot L^{apri}(k)/2 \quad (5).$$

In this case, equation 4 describes the calculation of asymmetric branch metrics, and equation 5 describes the calculation of symmetrical branch metrics. The symmetrical bit X(k), the parity bit Z(k) and the a priori information A(k) are input variables to an MAP decoder element. These describe the state transition and are comparable to the variables $W^i(k)$ in the calculation of the branch metrics. The variables $L^s(k)$, $L^P(k)$ and $L^{apri}(k)$ describe the soft input values which correspond to the variables X(k), Z(k) and A(k). Equation 4 and equation 5 can be changed in an analogous manner to equation 2 and equation 3 to tabular form, in which case the branch metrics $\chi_k(s,s')$ from equation 4 and equation 5 can be stated in the form $$a_1 \cdot L^s(k) + a_2 \cdot L^P(k) + a_3 \cdot L^{apri}(k) \text{ where } a_1, a_2, a_3 \in \{0,1\} \quad (6)$$

or in the form $$b_1 \cdot L^s(k)/2 + b_2 \cdot L^P(k)/2 + b_3 \cdot L^{apri}(k)/2 \text{ where } b_1, b_2, b_3 \in \{-1,1\} \quad (7)$$

In the case of asymmetric branch metrics, that is to say metrics in the form corresponding to equation 6, the branch metrics are calculated with the aid of the circuit according to the invention as shown in FIG. 4, in an analogous manner to the above statements. In the case of symmetrical branch metrics, there is in principle no need for the factor ½. In this case, the calculation is carried out with the aid of the circuit according to the invention in an analogous manner to the asymmetric branch metrics. If the factor ½ is considered for indication of the symmetrical branch metrics, then this can be achieved by a bit shift operation of the input words through one bit to the right. A corresponding configurable bit shift element (shift of one bit/shift of zero bits) could for this purpose in each case be added within the circuit to the inputs E1 to E4 of the circuit shown in FIG. 4.

Figure 5:
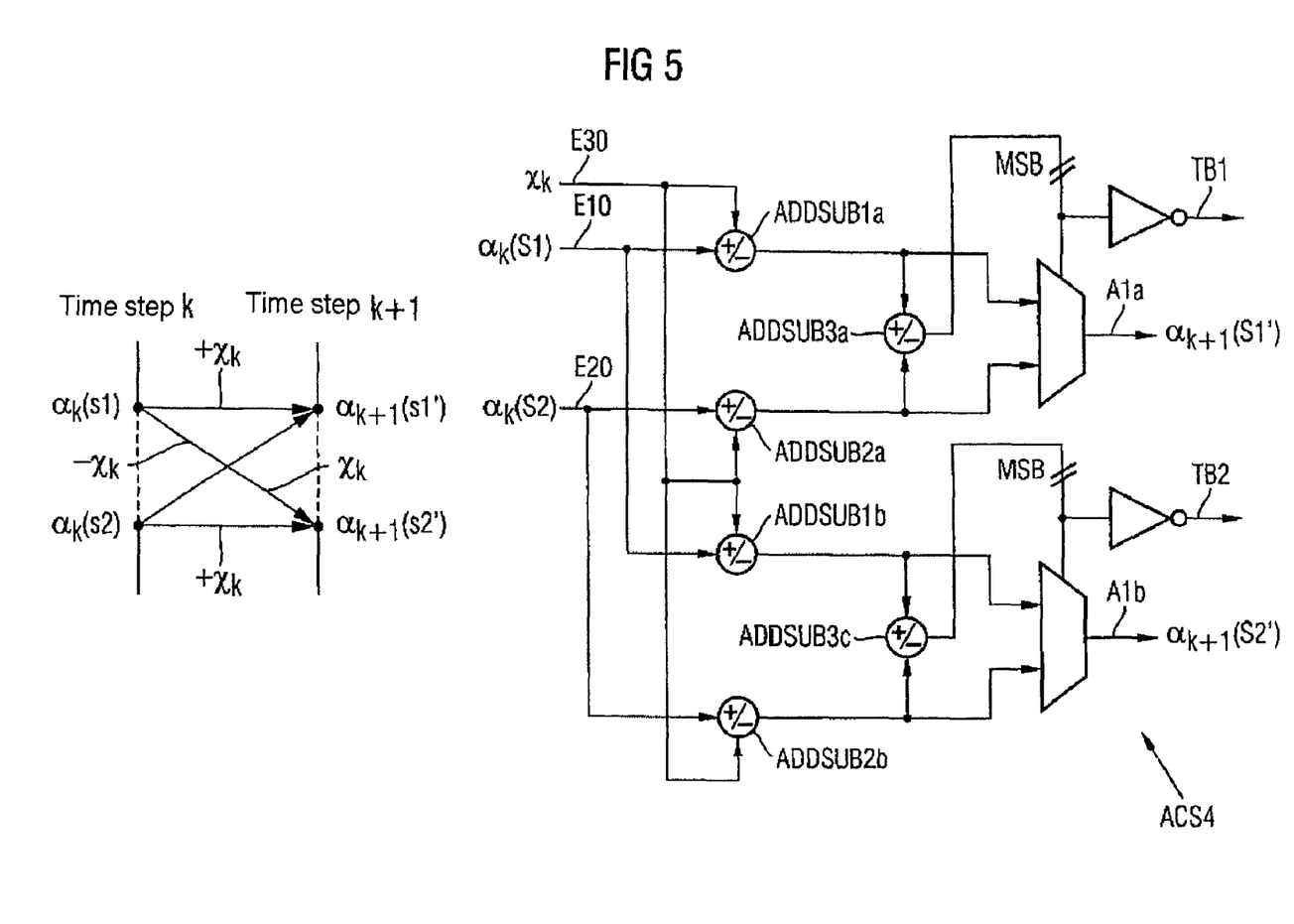
FIG. 5 is a schematic diagram illustrating a circuit according to a second exemplary embodiment of the invention.

FIG. 5 shows an illustration of a second exemplary embodiment of a circuit ACS4 according to the invention, based on the first aspect of the invention. The circuit ACS4 is based, as a combined circuit, on two circuits ACS2 as shown in FIG. 4. The circuit ACS4 is used for calculation of the state metrics $\alpha_{k+1}(s1')$ and $\alpha_{k+1}(s2')$ of a butterfly, as shown on the left in FIG. 5. All n transitions in a trellis diagram can in principle be subdivided into n/2 butterfly structures. With regard to a butterfly, it can be stated that the branch metrics $\chi_k(s1,s1')$ and $\chi_k(s2,s2')$ as well as $\chi_k(s1,s2')$ and $\chi_k(s2,s1')$ correspond to one another. Furthermore, if symmetrical branch metrics are used:

$$\chi_k(s1,s1') = \chi_k(s2,s2') = -\chi_k(s1,s2') = -\chi_k(s2,s1'). \quad (8)$$

The relationships from equation 8 are modelled internally in the circuit ACS4. The state metrics $\alpha_k(s1)$ and $\alpha_k(s2)$, respectively, are supplied to the inputs E10 and E20. Furthermore, only one branch metric $\chi_k$ is fed into the circuit at the input E30. The switchable computation elements ADDSUB1a to ADDSUB3a as well as ADDSUB1b to ADDSUB3b correspond to the switchable computation elements ADDSUB1 to ADDSUB3 from FIG. 4. The associated digital control signals (not illustrated) are used as illustrated in Table 5.

TABLE 5

Use of the control signals

| Control signal for computation element | Digital value |
|---|---|
| ADDSUB1a | 1 |
| ADDSUB2a | 0 |
| ADDSUB3a | 0 |
| ADDSUB1b | 0 |
| ADDSUB2b | 1 |
| ADDSUB3b | 0 |

The applied branch metric $\chi_k$ is taken into account with the correct mathematical sign in the determination of the state metrics $\alpha_{k+1}(s1')$ and, respectively, $\alpha_{k+1}(s2')$, by suitable switching of the computation elements, that is to say operation as adders or subtractors.

Figure 6:
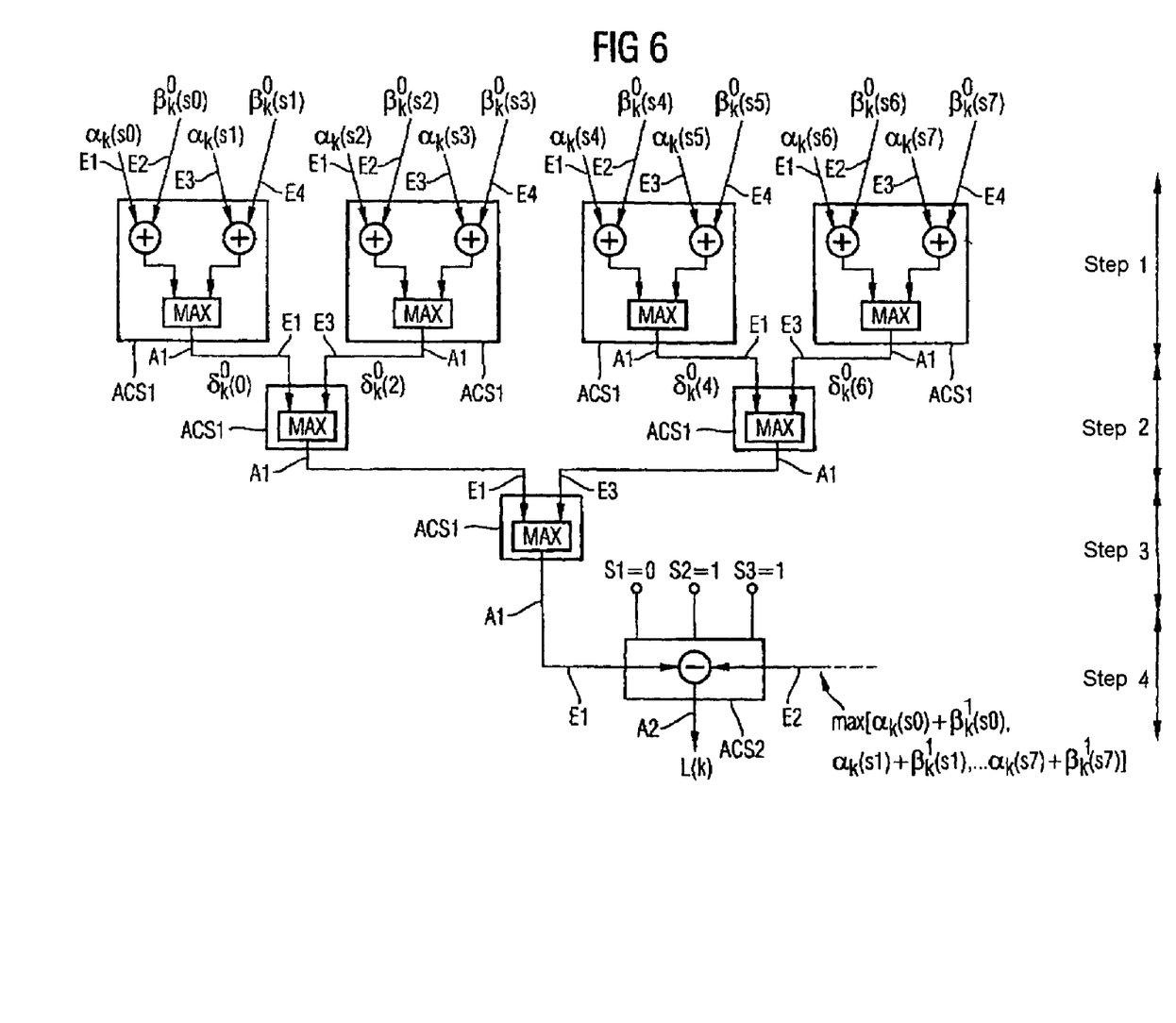
FIG. 6 is a schematic diagram illustrating the use of the circuits according to an embodiment of the invention, comprising an ACS circuit for the determination of a soft output value L(k) using the max log MAP algorithm.

FIG. 6 shows the use according to the invention of an ACS circuit for operations for the determination of a soft output value using the max log MAP algorithm. Soft output values L(k) can be calculated using the max log MAP algorithm by means of the following approximate equation:

$$L(k) = \max_{(s,s'); X(k)=0}(\alpha_k(s) + \chi_k(s,s') + \beta_{k+1}(s')) - \max_{(s,s'); X(k)=1}(\alpha_k(s) + \chi_k(s,s') + \beta_{k+1}(s')) \quad (9).$$

In this case, the argument of the first maximum operation in equation 9 includes only those state transitions (s,s') for the hypothesis U=0, that is to say that the state transition is logically linked to the transfer of a logic zero while, in contrast, the argument of the second maximum operation includes only those state transitions (s,s') for the hypothesis U=1.

Using the following definitions:

$$\alpha_{k+1}^0(s') := \alpha_k(s) + \chi_k(s,s') \text{ if } X(k)=0 \text{ for the transition } (s,s') \quad (10),$$

$$\alpha_{k+1}^1(s') := \alpha_k(s) + \chi_k(s,s') \text{ if } X(k)=1 \text{ for the transition } (s,s') \quad (11),$$

$$\beta_k^0(s') := \beta_{k+1}(s') + \chi_k(s,s') \text{ if } X(k)=0 \text{ for the transition } (s,s') \quad (12),$$

and $$\beta_k^1(s') := \beta_{k+1}(s') + \chi_k(s,s') \text{ if } X(k)=1 \text{ for the transition } (s,s') \quad (13)$$

the following relationships apply:

$$\alpha_k(s) = \max(\alpha_k^0(s), \alpha_k^1(s)) \quad (14)$$

and $$\beta_k(s) = \max(\beta_k^0(s), \beta_k^1(s)) \quad (15).$$

The soft output value L(k) on the basis of equation 9 can thus be determined either by means of $$L(k) = \max_{s'}(\alpha_k^0(s') + \beta_k(s')) - \max_{s'}((\alpha_k^1(s') + \beta_k(s')) \quad (16)$$

or alternatively by means of $$L(k) = \max_{s'}(\alpha_k(s') + \beta_k^0(s')) - \max_{s'}(\alpha_k(s') + \beta_k^1(s')) \quad (17)$$

The variables $\alpha_k^{0/1}(s')$ or $\beta_k^{0/1}(s')$ can thus be determined by tapping them off at the outputs A2 and A4 from the ACS circuit ACS2 as shown in FIG. 4.

By way of example, FIG. 6 shows the use according to the invention of an ACS circuit for operations for determination of a soft output value based on equation 17. The code that is used in the example has 8 states s0 to s7. In order to use an ACS circuit which has only inputs for two states, the two max operations in equation 17 are subdivided over all n states s' for the determination of a soft output value, that is to say in this case over 8 states s0 to s7, into a total of $$n_{max} = 2 \cdot \sum_{i=1}^{1d(n)} \frac{n}{2^i}$$

max operations each relating to only two states, that is to say in this case 14 max operations. The calculation is in this case subdivided in the form of a tree, as illustrated in FIG. 6; so that the expression calculation of a maximum tree is also used. In this case, either two forward and two backward state metrics or else two calculated intermediate results are applied as input variables to the inputs of an ACS circuit; the element which follows the input variables in the maximum tree is produced on the output side. The number of ACS circuits that are actually used need not correspond to the number $n_{max}$ of operations, since one or more ACS circuit or circuits can also be operated on a time-division multiplexing basis. The ACS circuit which is used to carry out operations for determination of a soft output value corresponds to the circuit ACS1 as illustrated in FIG. 1, although, in principle, a combined ACS circuit may, of course, also be used, which comprises two ACS circuits ACS1 in order to carry out butterfly operations. In FIG. 6, the block element MAX in each case contains the compare and select operation elements shown in FIG. 1. In a first step (see step 1 in FIG. 6), the variables $\alpha_k(si)$, $\beta_k^{0/1}(si)$, $\alpha_k(s(i+1))$, $\beta_k^{0/1}(s(i+1))$ are applied to the respective inputs E1 to E4 of one or more ACS circuits, and the intermediate results $$\delta_k^{0/1}(i) = \max(\alpha_k(si) + \beta_k^{0/1}(si), \alpha_k(s(i+1)) + \beta_k^{0/1}(s(i+1))) \text{ where } i = 0, 2, 4, \ldots n-2 \quad (18)$$

are tapped off at A1 on the output side. A total of n ACS circuits, that is to say 8 ACS circuits, are used for this purpose in the present case. The intermediate results can be temporarily stored and can be supplied as input variables once again to the above circuits, or can be applied directly as input variables to downstream ACS circuits ACS1. In the second step (see step 2 in FIG. 6), two intermediate results $\delta_k^{0/1}(i)$ are applied to each of the inputs E1 and E3 of an ACS circuit. The inputs E2 and E4, which are not shown, are in this case set to the value zero. The maximum of the two values which are in each case produced at the output A1 is once again determined in step 3. In order indicate the soft output value L(k), the intermediate results of the tree elements according to step 3 must be subtracted in accordance with equation 17 in step 4. The subtraction process can be carried out in particular, as is illustrated in FIG. 6, by means of an extended ACS circuit ACS2 as shown in FIG. 4.

Figure 7:
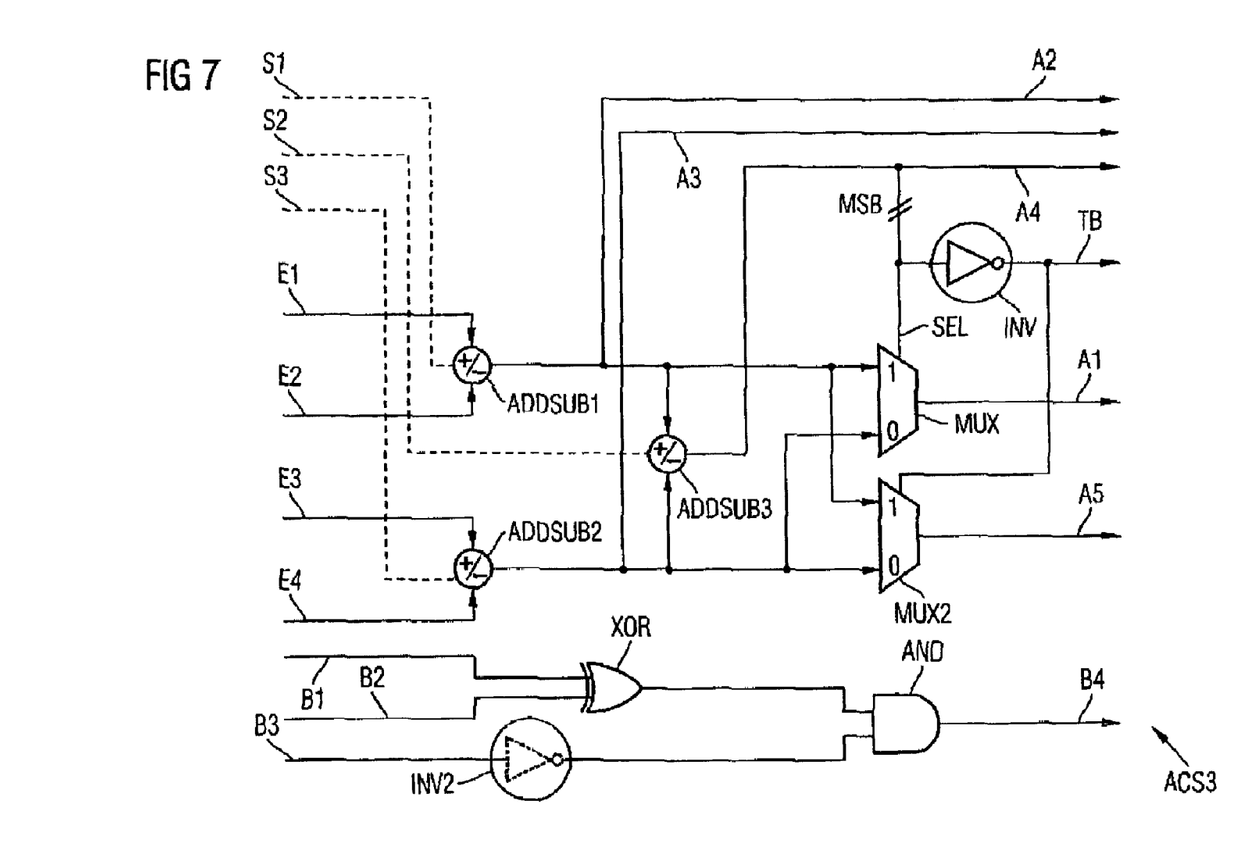
FIG. 7 is a schematic diagram illustrating a circuit according to yet another embodiment of the invention.

FIG. 7 shows one exemplary embodiment of a circuit ACS3 according to the invention, with the circuit relating both to the first and to the second aspect of the invention. In this case, the design and function of circuit parts in FIG. 7 and FIG. 4 correspond to one another, with the same reference symbols being used. In addition, the circuit shown in FIG. 7 has a second multiplexer MUX2. With regard to the input signals, this is driven in the same way as the first multiplexer MUX. The control signal SEL2 which drives the second multiplexer MUX2 is, however, inverted in comparison to the control signal SEL which drives the first multiplexer MUX. This results in the output A5 of the second multiplexer MUX2 producing the output signal from the switchable computation element ADDSUB1 when the output A1 of the first multiplexer MUX is producing the output signal from the switchable computation element ADDSUB2, and vice versa. Furthermore, the circuit shown in FIG. 7 has three binary inputs B1 to B3 and one binary output B4. The signals at the inputs B1 and B2 are logically linked via an XOR gate XOR. Furthermore, the signal B3 is optionally inverted by means of a second inverter INV2. The signal at B3 and the output signal from INV2 (when present) are logically linked with the output signal from the XOR gate XOR via an AND gate AND, whose output signal is supplied to the binary output B4.

The extensions to the circuit shown in FIG. 7 are used to carry out additional operations which relate to the SOVA. These additional operations have the common feature that a conditional minimum is formed, with the minimum being formed by the multiplexer MUX2.

The operation of the circuit shown in FIG. 7 for carrying out the SOVA will be explained in the following text with reference to FIG. 8. The SOVA is in this case carried out as a two-stage SOVA, in order to reduce the amount of memory. A simple Viterbi algorithm is carried out in a first step, in order to determine the ML path for the time step k. This corresponds in FIG. 8 to the combination of the arrows shown by bold lines. In a second step, an additional forward recursion process, which relates only to the SOVA, is carried out, with the soft output values L(k−i) furthermore being updated for all of the time steps k−i within the time window ws (see FIG. 8).

After carrying out the first step, the bit sequence $U^1 = [U^1(k-ws), U^1(k-ws+1), \ldots, U^1(k-1)]$ of the ML path is known. At the time k, the ML path opens into a state $s'_{ML}$ (see FIG. 8). Furthermore, the secondary path opens into the state $s'_{ML}$, with the metric for the secondary path being smaller than that for the ML path. The difference between the two metrics for the time k is the metric difference $\Delta k$, and is the point of origin for the indication of the soft output value.

First of all, the determination of the state metric for the secondary path to the ML path will be described with the aid of the circuit illustrated in FIG. 7. For this purpose, the circuit is connected on the input side as shown in Table 6. The signals indicated in Table 7 are produced on the output side.

TABLE 6

| Signals on the input side for the first SOVA operation | | | | | | | | | |
|---|---|---|---|---|---|---|---|---|---|
| E1 | E2 | E3 | E4 | S1 | S2 | S3 | B1 | B2 | B3 |
| $\alpha_{k-1}(s1)$ | $\chi_{k-1}(s1,s')$ | $\alpha_{k-1}(s2)$ | $\chi_{k-1}(s1,s')$ | 1 | 0 | 1 | $f\_\alpha_{k-1}(s1)$ | $f\_\alpha_{k-1}(s2)$ | $U^1(k-1)$ |

TABLE 7

| Signals on the output side for the first SOVA operation | | | | | |
|---|---|---|---|---|---|
| A1 | A2 | A3 | A4 | A5 | B4 |
| $\max_k(s')$ | — | — | — | $\min_k(s')$ | $f\_\alpha_k(s')$ |

In this case, $f_{13}$ $\alpha_{k-1}(s1)$, $f\_\alpha_{k-1}(s2)$, $f\_\alpha_k(s')$ denotes so-called flag bits, which are associated with the respective state metrics $\alpha_{k-1}(s1)$, $\alpha_{k-1}(s2)$ and $\alpha_k(s')$. Each flag bit is stored together with the state metric as memory word with a length of 13 bits—that is to say 1 bit longer than the information in the state metric—in the decoder memory. This describes whether a state metric is associated with the ML path. If the state metric is associated with the ML path, the corresponding flag bit is set. The following signal is produced at the output A1

$$\max_k(s') := \alpha_k(s') = \max(\alpha_{k-1}(s1) + \chi_{k-1}(s1,s'), \alpha_{k-1}(s2) + \chi_{k-1}(s2,s')) \quad (19),$$

while, in contrast, the following signal is produced at the output A5

$$\min_k(s') := \min(\alpha_{k-1}(s1) + \chi_{k-1}(s1,s'), \alpha_{k-1}(s2) + \chi_{k-1}(s2,s')) \quad (20).$$

Figure 8:
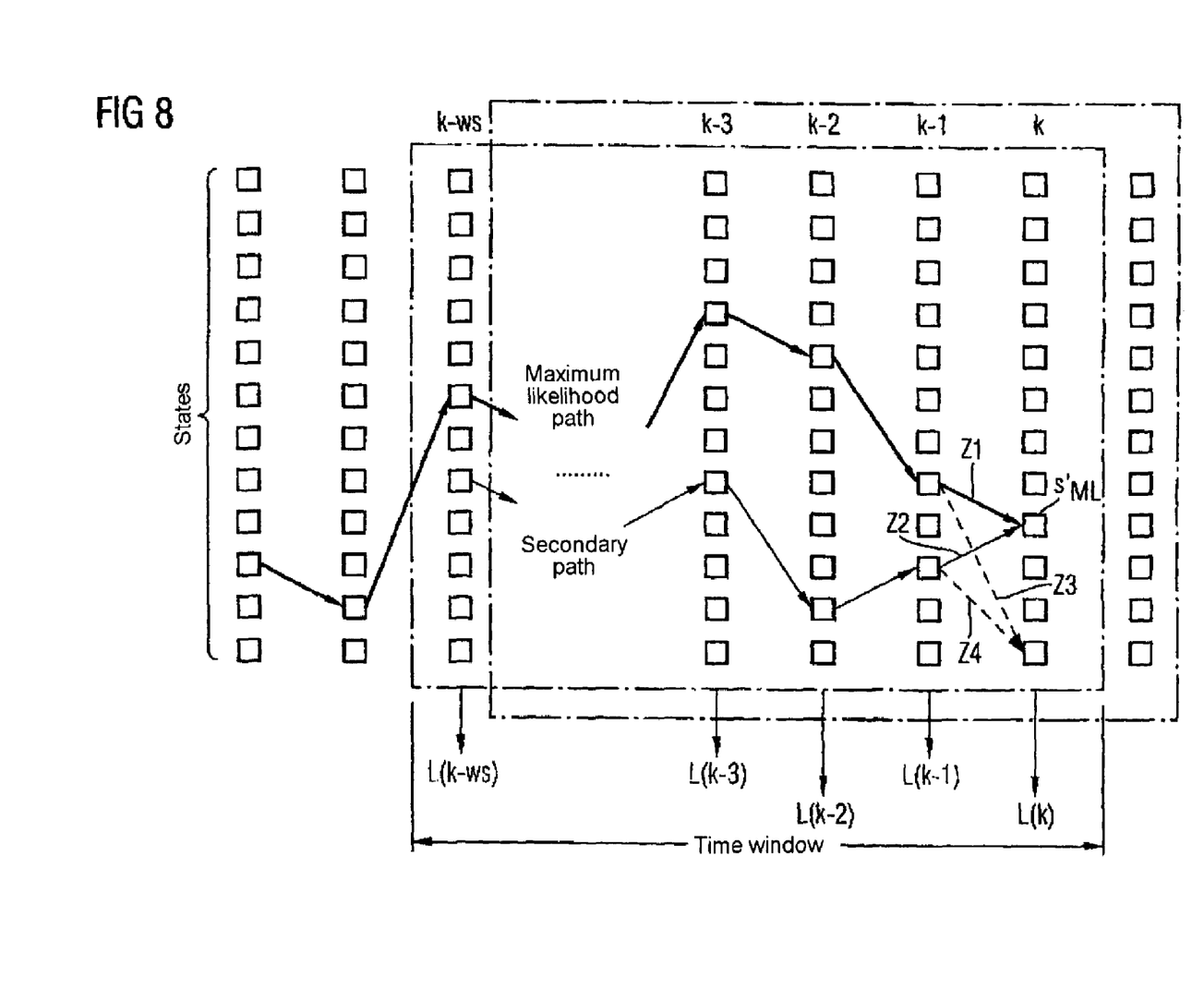
FIG. 8 is a trellis diagram illustrating the SOVA.

If the state s' occurs for time k on the ML path, that is to say s'=s'$_{ML}$, then max$_k$(s'$_{ML}$) indicates the metric for the ML path and min$_k$(s'$_{ML}$) indicates the path metric for the secondary path. During the forward recursion process, the values max$_k$(s') and min$_k$(s') are determined for all states s'. However, only the value of min$_k$(s'$_{ml}$), in addition to the value of max$_k$(s'$_{ml}$) is relevant for indication of the metric of the secondary path to the ML path, and thus for indication of the metric difference $\Delta_k$. The flag bits are used to mark the value min$_k$(s'$_{ML}$) from the totality of the values min$_k$(s'). They are used in the same way to mark the value max$_k$(s'$_{ML}$) from the totality of the values max$_k$(s'). The flag bits are calculated iteratively. An output flag bit f_$\alpha_{k-1}$(s') is set only when one of the flag bits f_$\alpha_{k-1}$(s1) at B1 or f_$\alpha_{k-1}$(s2) at B2 is set, that is to say when one of the state metrics $\alpha_{k-1}$(s1) or $\alpha_{k-1}$(s2) is associated with the ML path. Furthermore, the setting of the flag bit f_$\alpha_{k-1}$(s') additionally depends on the bit U$^1$(k−1) for the ML path, which has already been decided and is supplied via B3, relating to the transition from the time step k−1 to the time step k. This will be explained in the following text:

Two ACS circuits as shown in FIG. 7 are used to carry out the forward recursion process for a butterfly, for example a butterfly with the transitions Z1, Z2, Z3 and Z4 (see FIG. 8). In this case the first circuit of a butterfly relates to the transitions Z1 and Z2 which are associated with a first hypothesis U=1 while, in contrast, the second circuit is associated with the transitions Z3 and Z4 which originate from a hypothesis U=0. The inverter INV2 is not used in first ACS circuits of a butterfly as shown in FIG. 7, which are associated with a hypothesis U=1, while an inverter INV2 is present in second ACS circuits for a butterfly as shown in FIG. 7 which are associated with a hypothesis U=0. In principle, it is possible to make inversion of the input signal at B3 switchable, in order to use only one circuit type. If the bit U$^1$(k−1) which has been decided and is already known for the ML path is, for example, a logic 1, the flag bit f_$\alpha_k$(s') may be set only at the output of the first ACS circuit (for a hypothesis U=1), and not at the output of the second ACS circuit for the same butterfly. The signal at the input B3 is therefore in this case logically linked to the output signal from the XOR gate XOR via the AND gate AND. If the bit U$^1$(k−1) for the ML path which has already been decided and is already known is, for example, a logic 0, the flag bit f_$\alpha_k$(s') may be set only at the output of a second ACS circuit (for a hypothesis U=0), and not at the output of the first ACS circuit for the same butterfly. The signal at the input B3 is therefore in this case first of all inverted, and is then logically linked with the output signal from the XOR gate XOR via the AND gate AND.

In principle, the ML path starts in the so-called zero state for the time step k=0. The flag bit for this state for the time step k=0 is initialized to 1, and all of the flag bits for the other states for the time step k=0 are initialized to 0. Then, as described above, the flag bit that is set changes by one time step along the ML path for each forward recursion process. A calculated minimum min$_k$(s') at the output A5 is used for indication of the metric of the secondary path only when the flag bit f_$\alpha_k$(s') is set, that is to say when the state s' is associated with the ML path.

In this case, the calculated minimum is the metric for the secondary path min$_k$(s'$_{ML}$).

The circuit in FIG. 7 could also be extended by the addition of an additional subtractor so as to calculate the difference between max$_k$(s') and min$_k$(s'), resulting in the metric difference $\Delta_k$ in the case where max$_k$(s'$_{ML}$) and min$_k$(s'$_{ML}$) respectively that is to say when a flag bit f_$\alpha_k$(s') is set.

Furthermore, the circuit shown in FIG. 7 is also used for subsequent updating of the soft output values L(k−i) (secondary traceback) based on equation 1 for all the time steps k−i where i=1, 2, . . . , ws. During the updating process, a so-called traceback is carried out and a provisional soft output value L(k−i), which has already been determined, for the time k−i for each time step k−i in a time window ws (see FIG. 8) is replaced by the minimum of the respective provisional soft output value and the metric difference $\Delta_k$ if the decoded bit for the ML path U$^1$(k−i) for the time step k−i and the bit associated with the secondary path for the time step k−i do not match.

The circuit configuration as shown in FIG. 7 that is used for updating a soft output value L(k−i) for the time step k−i is shown in Table 8 and Table 9. In this case, the metric difference $\Delta_k$ is applied to the input E1 for the soft output value L(k−i) to be updated and to the input E3. Furthermore, the decided bit U$^1$(k−i) for the ML path and the corresponding bit U$^2$(k−i) for the secondary path are read in at the inputs B1 and B2. The use of B3 depends on whether an inverter INV2 is present. If an inverter INV2 is present, B3 must be at a logic 0, otherwise at a logic 1. This means that the AND gate AND has no effect. The minimum of L(k−i) and $\Delta_k$ is produced at the output A5. Furthermore, a flag bit f$_{valid}$ is calculated as a function of the bits applied to B1 and B2.

TABLE 8

Input-side signals for the second SOVA operation

| E1 | E2 | E3 | E4 | S1 | S2 | S3 | B1 | B2 | B3 |
|---|---|---|---|---|---|---|---|---|---|
| L(k − i) | 0 | $\Delta_k$ | 0 | 1 | 0 | 1 | U$^1$(k − i) | U$^2$(k − i) | 0/1 |

TABLE 9

Output-side signals for the second SOVA operation

| A1 | A2 | A3 | A4 | A5 | B4 |
|---|---|---|---|---|---|
| — | — | — | — | min(L(k − i), $\Delta_k$) | f$_{valid}$ |

Since the circuit-internal calculation of the minimum is independent of the values of U$^1$(k−i) and U$^2$(k−i), the downstream circuit parts must be signalled on the basis of the flag bit f$_{valid}$ as to whether the calculated minimum should or should not used for updating purposes. If the two bits U$^1$(k−i) and U$^2$(k−i) differ from one another, the bit f$_{valid}$ is set; if the two bits U$^1$(k−i) and U$^2$(k−i) are the same, a logic 0 is produced for f$_{valid}$ at the output B4. The minimum must therefore be used for the updating process when the output B4 for the flag bit f$_{valid}$ signals a logic 1.

Instead of the output signal from the multiplexer being supplied directly to the output A5, the output signal from the multiplexer MUX2 could also be supplied to a switch, with the closing and opening of the switch being controlled by the output signal from the AND gate AND. In this case, a signal is produced at the output of the switch only when the output signal from the AND gate AND is set. An analogous procedure could be used for the output of the multiplexer MUX.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A circuit for carrying out computation operations for a trellis-based algorithm, comprising:
a circuit configured to carry out an add compare select operation for determination of a state metric associated with the trellis, and configured to output the determined state metric at a first output; and
a second output of the circuit configured to emit at least one circuit-internal variable in addition to the determined state metric, wherein the second output is configured to output a determination of a branch metric associated with the determined state metric.

2. The circuit of claim 1, wherein the trellis-based algorithm comprises at least one of a Viterbi algorithm, a logarithmically operating MAP algorithm, and a soft output Viterbi algorithm.

3. The circuit of claim 1, wherein the circuit comprises at least one computation means configured to carry out the add compare select operation, wherein the at least one computation means is selectively configurable to perform subtraction or addition based on a state of a control signal coupled thereto.

4. The circuit of claim 1, wherein the circuit comprises:
two add circuits coupled to a circuit input;
a compare circuit coupled to an output of the two add circuits; and
a select circuit coupled to an output of the compare circuit and to a circuit output,
wherein at least one circuit-internal variable comprises a variable at the output of one of the two add circuits or a variable at the output of the compare circuit.

5. The circuit of claim 4, wherein the circuit further comprises an inverter coupled to the output of the compare circuit, wherein the inverter is operable to output a traceback bit at an output of the circuit based on a portion of a signal at the output of the compare circuit.

6. The circuit of claim 1, wherein the circuit is operable to perform computation operations for both a Viterbi algorithm and a max log MAP algorithm, wherein computation operations performed by the circuit comprise:
a branch metric calculation for both of the Viterbi algorithm and the max log MAP algorithm;
a state metric calculation of the Viterbi algorithm;
a backward and forward state metric calculation for the max log MAP algorithm;
a determination of a traceback bit for the Viterbi algorithm; and
a determination of soft output values from the state metrics of the max log MAP algorithm.

7. A circuit for carrying out computation operations for a soft output Viterbi algorithm, comprising:
a circuit configured to carry out an add compare select operation for determination of a state metric associated with a maximum likelihood path of a trellis; and
means for determining a minimum representing a metric for a secondary path of the trellis, wherein the means for determining the minimum is configured to output the metric representing the secondary path at an output thereof as a function of a condition of a plurality of inputs thereto comprising state metrics and branch metrics associated with an earlier time step of the trellis.

8. The circuit of claim 7, wherein the means for determining the minimum is further operable to provide a validation indication of the minimum determination at an output thereof.

9. The circuit of claim 8, wherein the means for determining the minimum further comprises a validation indication circuit configured to receive one or more additional input variables that signal an association between the state metrics for the earlier time step of the trellis for the maximum likelihood path, wherein the validation indication circuit comprises:
a first input configured to receive a first signalling bit that is associated with a first state metric that is provided as an input to the add compare select computation circuit; and
a second input configured to receive a second signalling bit that is associated with a second state metric that is provided as an input to the add compare select computation circuit,
wherein the first and the second signalling bits signal the association, respectively, between the first and the second state metrics that are read in for the earlier time step of the trellis and the maximum likelihood path.

10. The circuit of claim 9, wherein the validation indication circuit further comprises a third input configured to receive of a decision bit indicative of whether the output of the add compare selection circuit represents the state metric for the maximum likelihood path relating to a transition from the earlier time step to a present time step in the trellis.

11. The circuit of claim 10, wherein the validation indication circuit is configured to output a third signalling bit that is associated with the state metric output by the add compare select circuit for the present time step in the trellis, and wherein the third signalling bit signals an association between the add compare select circuit state metric output and the maximum likelihood path only when either the first signalling bit or the second signalling bit signals an association between corresponding state metrics for the earlier time step in the trellis.

12. The circuit of claim 7, further comprising a difference calculation circuit configured to determine a difference between the metrics of the maximum likelihood path and the secondary path for a given time step.

13. The circuit according to claim 10, wherein the means for determining the minimum and the validation circuit are further operably to collectively update a soft output value for a previous time step within an updating window of the trellis, wherein soft output values that are required for updating are read in via the inputs to the determining means, and wherein the validation indication circuit is configured to receive at a first input a bit associated with the previous time step for the maximum likelihood path, and receive at a second input a bit associated with the previous time step for the secondary path.

14. The circuit of claim 13, wherein the validation indication circuit is further configured to output a third signalling bit based on the bits at the first and second inputs, wherein a value of a third signalling bit depends on whether the bits at the first and second inputs are identical.

15. A computation circuit for computation operations in a trellis-based algorithm, comprising:
- a first switchable computation element configured to add or subtract values at first and second inputs thereof based on a state of a first control signal coupled thereto, and provide a result of the addition or subtraction at a first computation element output;
- a second switchable computation element configured to add or subtract values at first and second inputs thereof based on a state of a second control signal coupled thereto, and provide a result of the addition or subtraction at a second computation element output;
- a third switchable computation element configured to add or subtract values associated with the first and second computation element outputs, respectively, at first and second inputs thereof based on a state of a third control signal coupled thereto, and provide a result of the addition or subtraction at a third computation element output;
- a selection circuit having a first input coupled to the first computation element output, a second input coupled to the second computation element output, and a control input coupled to an output of the third switchable computation element, wherein the selection circuit is configured to output a signal associated with the first computation element output or the second computation element output based on a state of the output of the third switchable computation element, and
- wherein the output of the selection circuit comprises an output of the computation circuit;
- wherein the first computation element output comprises a second output of the computation circuit, the second computation element output comprises a third output of the computation circuit, and the third computation element output comprises a fourth output of the computation circuit.

16. The computation circuit of claim 15, wherein in a first mode the first and second control signals are in a state causing the first and second switchable computation elements to perform an addition operation, and the third control signal is in a state causing the third switchable computation element to perform a subtraction operation, and wherein the computation circuit is configured to perform an add compare select operation on signals at the inputs of the first and second switchable computation elements.

17. The computation circuit of claim 16, wherein:
- a first input of the first switchable computation element comprises a state metric of a first state at a present time step in a trellis, and a second input of the first switchable computation element comprises a branch metric associated with the first state and a state at the next time step in the trellis;
- a first input of the second switchable computation element comprises a state metric of a second state at a present time step in a trellis, and a second input of the second switchable computation element comprises a branch metric associated with the second state and the state at the next time step in the trellis; and
- the first output of the computation circuit outputs a state metric for the state at the next time step in the trellis.

18. The computation circuit of claim 15, wherein the first, second and third control signals are configured to selectively add or subtract values at the inputs of the first, second and third selectable computation elements based on a unique state transition associated with the trellis.

* * * * *